(12) United States Patent
Satoyoshi et al.

(10) Patent No.: US 6,387,208 B2
(45) Date of Patent: May 14, 2002

(54) INDUCTIVE COUPLING PLASMA PROCESSING APPARATUS

(75) Inventors: Tsutomu Satoyoshi; Kenji Amano, both of Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/897,954

(22) Filed: Jul. 5, 2001

(30) Foreign Application Priority Data

Jul. 7, 2000 (JP) ........................................ 2000-206764

(51) Int. Cl.[7] .............................. H01L 21/00; H05H 1/00
(52) U.S. Cl. .................................... 156/345; 118/723 I
(58) Field of Search ........................ 156/345; 118/723 I

(56) References Cited

U.S. PATENT DOCUMENTS 6,024,827 A * 2/2000 Ishii ........................... 156/345
6,051,151 A * 4/2000 Keller et al. ............... 118/723 I

FOREIGN PATENT DOCUMENTS

JP           9-199487         7/1997
JP          11-45878          2/1999

* cited by examiner

*Primary Examiner*—Thi Dang
(74) *Attorney, Agent, or Firm*—Oblon, Spivak, McClelland, Maier & Neustadt, P.C.

(57) ABSTRACT

There is disclosed an inductive coupling plasma processing apparatus having a processing chamber for subjecting a substrate G to a plasma processing, a dielectric wall portion constituting an upper part wall portion or a side wall portion of the chamber, a high-frequency antenna, disposed on a corresponding portion of the dielectric wall portion outside the chamber, for forming an induction field in the chamber, a cover member formed of a dielectric material disposed inside the dielectric wall portion to cover the dielectric wall portion, a heater for heating the cover member, and an insulating member for insulating between the dielectric wall portion and the heater, wherein a reaction product generated by a plasma is heated at a temperature without adhering to the cover member, and heat generated by the heater is prevented from being conducted to the dielectric wall portion.

12 Claims, 4 Drawing Sheets

INDUCTIVE COUPLING PLASMA PROCESSING APPARATUS

CROSS-REFERENCE TO RELATED APPLICATIONS

This application is based upon and claims the benefit of priority from the prior Japanese Patent Application No. 2000-206764, filed Jul. 7, 2000, the entire contents of which are incorporated herein by reference.

BACKGROUND OF THE INVENTION

1. Field of the Invention

The present invention relates to an inductive coupling plasma processing apparatus for applying plasma processing such as dry etching to substrates to be treated such as a liquid crystal display (LCD) substrate by an inductive coupling plasma.

2. Description of the Related Art

In general, in an LCD manufacturing process, an LCD glass substrate as a substrate to be treated is frequently subjected to etching, sputtering, chemical vapor-phase development (CVD) or another plasma processing. Various plasma processing apparatuses for performing the plasma processing have been used, and among these an inductive coupling plasma (ICP) processing apparatus is known which can generate a high-density plasma in an area inside a processing chamber.

Typically in the inductive coupling plasma processing apparatus, a ceiling of a processing chamber (area in the processing chamber) for performing the plasma processing in a vacuum is constituted of a dielectric wall portion, and a high-frequency (RF) antenna is disposed on the portion. Moreover, when a high-frequency power is supplied to the high-frequency antenna, an induction field is formed in the processing chamber. A process gas introduced into the processing chamber is formed into a plasma by the induction field, and etching or another processing is applied by an action of the plasma.

One problem of the inductive coupling plasma processing apparatus is the adverse influence of particles generated in the processing chamber on the material to be treated. In this case, reaction byproducts generated in the substrate processing chamber when a processing is performed are deposited onto the dielectric wall portion or the like, and may end up on the surface of the substrate. During an etching process the byproduct acts as a mask, causing a problem in which the area under the mask cannot be etched. Moreover, when a film forming process is performed, a film is also deposited on the reaction product, and included in the formed film. Therefore, problems occur such as disconnections of a wiring pattern and structural defects of a circuit device.

As a technique for preventing the reaction product from adhering to the substrate, as disclosed, for example, in Jpn. Pat. Appln. KOKAI Publication Nos. 11-45878 and 9-199487, a technique of disposing a heater or the like in the dielectric wall portion and heating the dielectric wall portion at a predetermined temperature is known. However, when the dielectric wall portion is heated and temperature is adjusted to bring the portion to a high-temperature state as in the conventional techniques, the thermal capacity of the dielectric wall portion is large, heat dissipation toward an atmospheric side is large, power consumption increases, and energy efficiency is deteriorated.

In recent years, there have been demands for larger LCD display screens, therefore, the LCD glass substrate has consequently also enlarged. For this, a huge substrate whose side is as large as 1 m is necessary. Accordingly, the processing apparatus is enlarged in size, the dielectric wall portion has also to be enlarged, the power consumption increases further, and the energy efficiency is remarkably deteriorated.

On the other hand, the reaction product can easily be inhibited from being deposited in the dielectric wall portion at a higher heating temperature. However, a gate via which the material to be treated is supplied/removed is hermetically sealed by a rubber material such as an O-ring, or a seal member of resin. Therefore, the heating temperature is limited by the melting point of the seal member.

BRIEF SUMMARY OF THE INVENTION

An object of the present invention is to provide an inductive coupling plasma processing apparatus which can be heated with a high energy efficiency in order to inhibit a reaction product from being deposited, and which can be heated without considering the melting point of a seal member for sealing a dielectric wall portion and a processing chamber.

To achieve the project, according to the present invention, there is provided an inductive coupling plasma processing apparatus comprising: a lower chamber forming a processing chamber in which a substrate to be treated is subjected to a plasma processing; an upper chamber forming an antenna chamber in which a high-frequency antenna for forming an induction field in the processing chamber by a high-frequency power supplied from the outside is disposed; a dielectric wall partitioning the upper chamber from the lower chamber; a shower head portion comprising an ejection port for ejecting a process gas and a gas channel, provided in the processing chamber; insulating means attached to the surface of the dielectric wall portion on a side of the processing chamber; heating means disposed on the surface of the insulating means on the processing chamber side; and a cover member formed of a dielectric material attached to the heating means on the processing chamber side, wherein the insulating means prevents heat generated from the heating means from being conducted to the dielectric wall portion, and the heating means heats the cover member at a temperature at which a reaction product generated by a plasma is prevented from adhering to the cover member.

The insulating means comprises an insulating member formed by the dielectric material held between the dielectric wall portion and the heating means. Moreover, the insulating means has a gap disposed between the dielectric wall portion and the heating means.

Furthermore, there is provided an inductive coupling plasma processing apparatus including a processing chamber in which a plasma is generated in an atmosphere including a process gas, a high-frequency antenna for receiving high-frequency power and generating an inductive electric field in the processing chamber, and a dielectric wall disposed to contact the plasma, the inductive coupling plasma processing apparatus comprising: a cover member disposed to prevent a main portion of the dielectric wall portion from being exposed in the processing chamber, and formed of a dielectric material; heating means for heating the cover member at a temperature at which a reaction product produced by the plasma generated in the processing chamber is inhibited from adhering to the cover member; and insulating means for preventing a heat generated by the heating means from being conducted to the dielectric wall portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Preferred embodiments of the present invention will be described hereinafter in detail with reference to the drawings.

Figure 1:
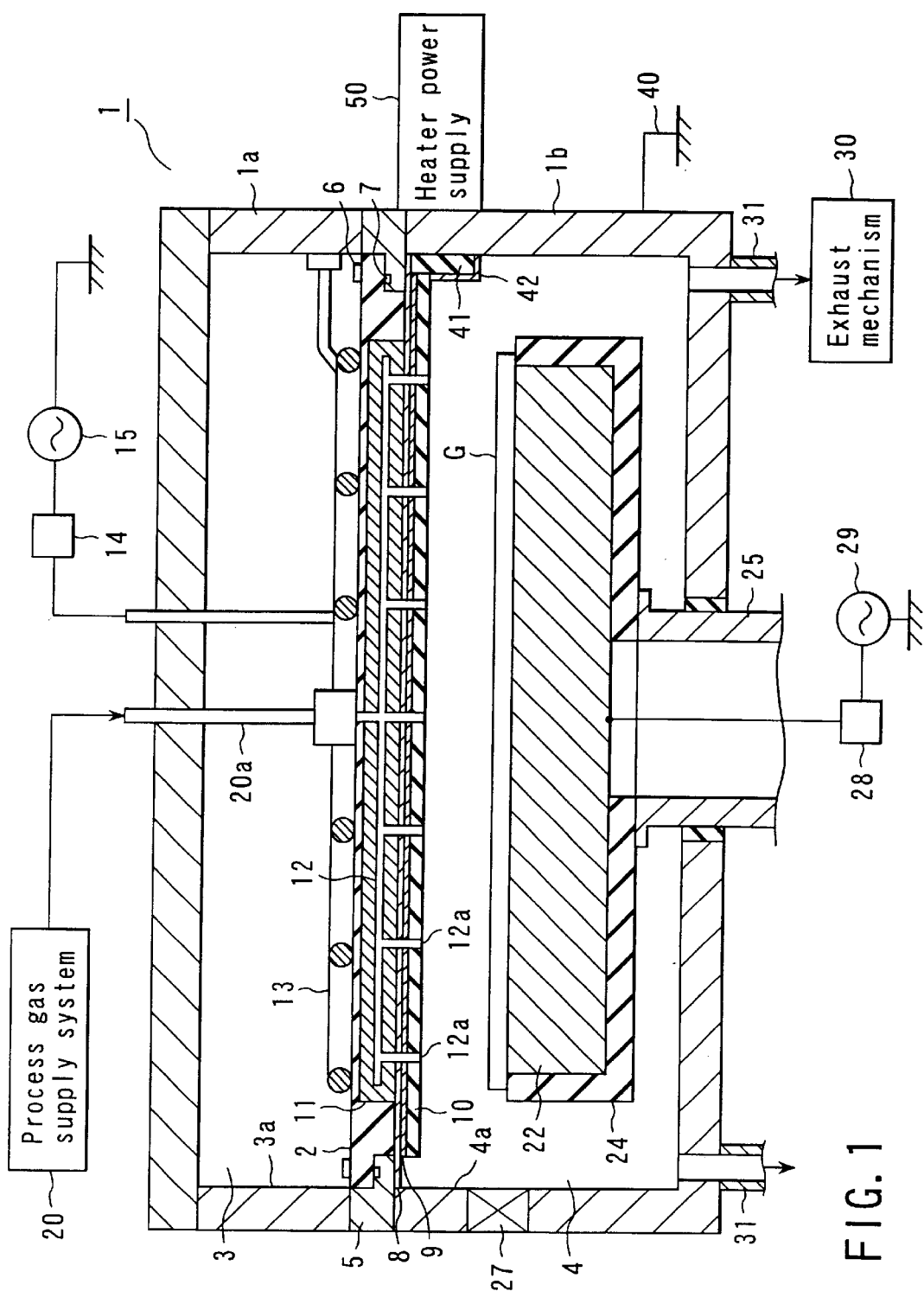
FIG. 1 is a sectional view showing an inductive plasma etching apparatus according to a first embodiment of the present invention.

FIG. 1 is a diagram showing a sectional constitution of a first embodiment in an inductive plasma etching apparatus of the present invention. In the first embodiment, the inductive plasma etching apparatus will be described as one example. The apparatus is used to etch a metal film, ITO film, oxide film, and the like in a manufacturing process for forming a thin film transistor on a square LED glass substrate in LCD manufacturing.

The etching apparatus includes a square rod shaped hermetic chamber 1 of aluminum whose inner wall surface has been anodized. The chamber 1 is grounded via a grounding wire 40. This chamber 1 can be disassembled into a plurality of portions. For example, the chamber 1 is vertically divided into an upper chamber 1a and a lower chamber 1b via a support shelf 5 for supporting a dielectric wall portion 2. An area in the upper chamber 1a is formed as an antenna chamber 3, and an area in the lower chamber 1b is formed as a processing area 4. Moreover, the dielectric wall portion 2 is formed of ceramic such as Al$_2$O$_3$, quartz, and the like, and functions as a ceiling of the processing area 4. The support shelf 5 is disposed to project inwardly between a side wall 3a of the antenna chamber 3 and a side wall 4a of the chamber 1, and the dielectric wall portion 2 is inserted into the projected portion via a resin seal ring 7 and fixed via a vis 6.

A sheet-shaped heater 9 is disposed substantially on the whole lower surface of the dielectric wall portion 2 via an insulating member 8, and is further covered with a cover member 10 constituted of a dielectric material such as ceramic or quartz. A lead wire of the sheet-shaped heater 9 is connected to a heater power supply 50 as described later through an insulating member 41 and the side wall 4a of the chamber 1. An outer periphery of the insulating member 41 is covered with an aluminum cover 42. By this constitution, the sheet-shaped heater 9 heats the cover member 10 by a power supplied from the heater power supply 50, but is insulated from the heat of the dielectric wall portion 2 side by the insulating member 8.

Figure 2:
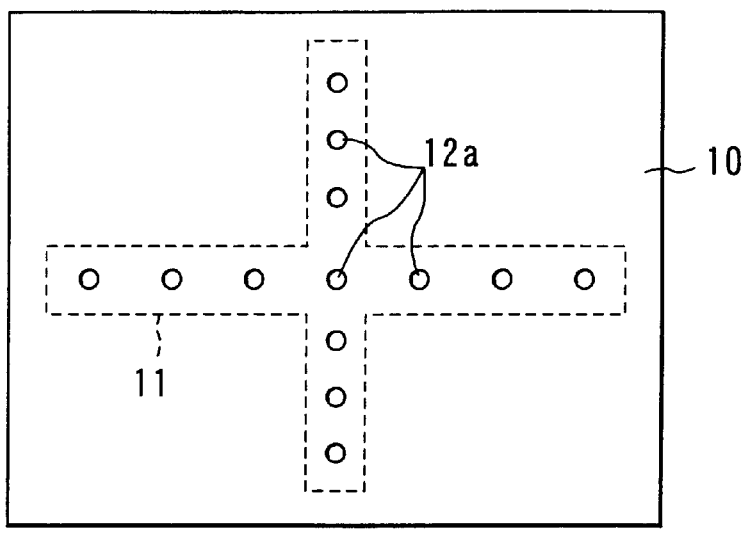
FIG. 2 is a diagram of a cover member for use in a plasma processing apparatus shown in FIG. 1 as seen from a susceptor side.

The dielectric wall portion 2 can also be disassembled, and a shower housing 11 for supplying a process gas is attached inside the portion. The shower housing 11 has a cross shape as shown in FIG. 2, and is structured to support the dielectric wall portion 2 from below. The shower housing 11 for supporting the dielectric wall portion 2 is hung from a ceiling of the chamber 1 by a plurality of suspenders (not shown). This shower housing 11 is preferably formed of a conductive material such as a metal, and the preferable metal material is an aluminum material whose inner surface has been anodized in order to prevent contaminants from being generated.

A horizontally extending gas channel 12 is formed in the shower housing 11. The gas channel 12 is connected to a plurality of downward extending gas ejection holes 12a on a bottom surface of the dielectric wall portion 2, insulating member 8, sheet-shaped heater 9 and cover member 10. On the other hand, a gas supply tube 20a is disposed on an upper surface middle portion of the dielectric wall portion 2 and connected to the gas channel 12. The gas supply tube 20a extends outward from the ceiling of the chamber 1, and is connected to a process gas supply system 20 including a process gas supply, valve system, and the like. In the plasma processing, the process gas supplied from the gas supply system 20 is supplied to the shower housing 11 via the gas supply tube 20a, and ejected into the chamber 1 via the gas supply holes 12a formed in the lower surface of the housing.

Moreover, a high-frequency (RF) antenna 13 is disposed to contact the upper surface of the dielectric wall portion 2 inside the antenna chamber 3. This high-frequency antenna 13 is formed of a flat coil antenna forming a substantially square spiral shape. A spiral center end of the high-frequency antenna 13 is guided out of the ceiling of the chamber 1, and connected to a high-frequency power supply 15 via a matching unit 14. On the other hand, an outer spiral end of the antenna is connected to the chamber 1, and therefore has a ground potential.

In this constitution, a high-frequency power, for example, having a frequency of 13.56 MHz is applied to the high-frequency antenna 13 in order to form an induction field from the high-frequency power supply 15 during the plasma processing. Moreover, the induction field is formed in the processing chamber 4 by the high-frequency antenna 13, and the process gas supplied from the shower housing 11 is formed into a plasma by the induction field. In this case, an output of the high-frequency power supply 15 is appropriately set to a value sufficient for generating the plasma.

A susceptor 22 as a base for laying an LCD glass substrate G thereon is disposed opposite to the high-frequency antenna 13 via the dielectric wall portion 2 in a lower part of the processing chamber 4. The susceptor 22 is constituted of a conductive material such as aluminum whose surface has been anodized. The LCD glass substrate G is attached to held on the susceptor 22 by an electrostatic chuck (not shown).

The susceptor 22 is contained in an insulating frame 24, and supported by a hollow column 25. Moreover, a gate valve 27 for supplying/removing the glass substrate G is disposed in the lower chamber 1b.

The susceptor 22 is connected to a high-frequency power supply 29 via a matching unit 28 by a power supply rod disposed in the hollow column 25. The high-frequency power supply 29 applies a biasing high-frequency power such as a high-frequency power with a frequency of 6 MHz to the susceptor 22 during the plasma processing. Ions in the plasma generated in the chamber 1 are effectively drawn into the glass substrate G by this biasing high-frequency power.

Furthermore, a temperature control mechanism formed of a ceramic heater or another heating member, refrigerant channel, and the like and a temperature sensor (not shown) are disposed in the susceptor 22 in order to control the temperature of the glass substrate G. A piping and wiring for these mechanism and member are drawn out of the chamber 1 via the hollow column 25.

Additionally, a bottom part of the lower chamber 1b is connected to an exhaust mechanism 30 including a vacuum pump, and the like via an exhaust pipe 31. This exhaust mechanism 30 includes a vacuum pump and a valve for adjusting an exhaust amount, evacuates the inside of the chamber 1, and sets/maintains the pressure inside the chamber 1 during the plasma (e.g., 1.33 Pa).

Figure 3:
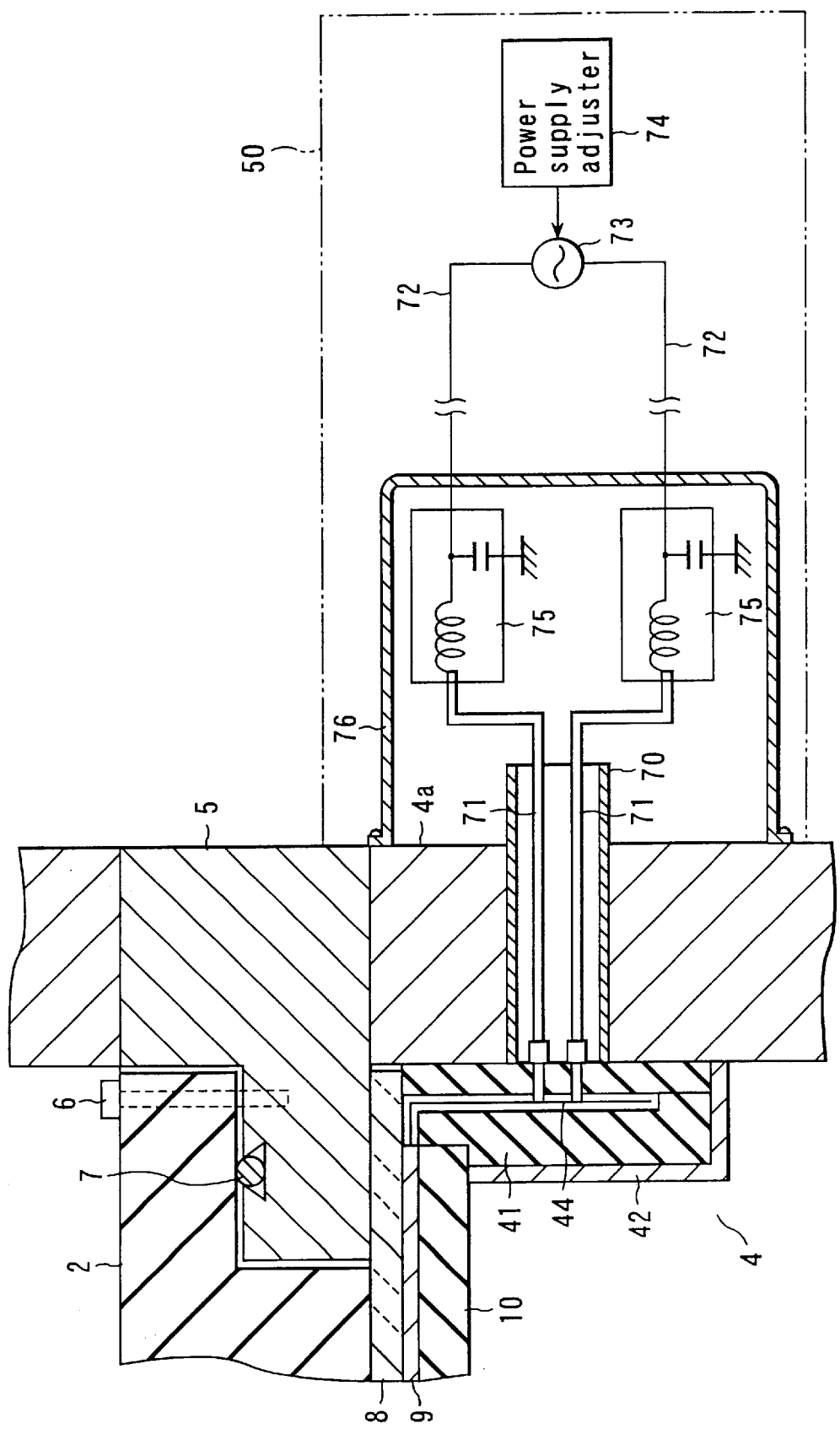
FIG. 3 is an enlarged sectional view of a main part of the plasma processing apparatus shown in FIG. 1.

A structure of a periphery of the dielectric wall portion 2 and a power supply mechanism of the sheet-shaped heater will next be described in detail with reference to FIG. 3.

Figure 4:
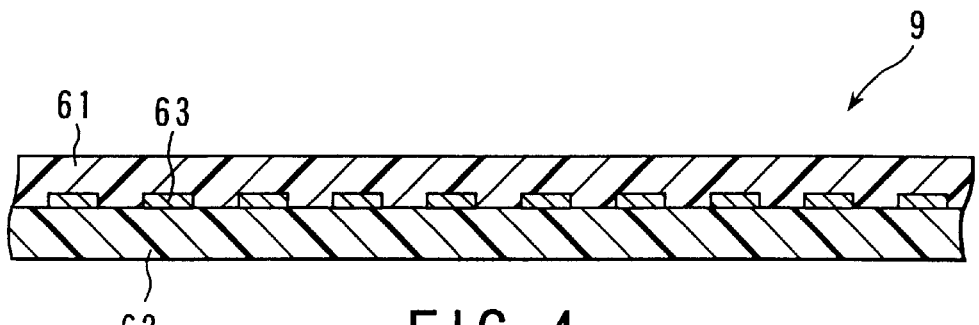
FIG. 4 is a sectional view showing a sheet-like heater for use in the plasma processing apparatus shown in FIG. 1.

As described above, the substantial whole lower surface of the dielectric wall portion 2 is covered with the cover member 10 formed of the dielectric material such as ceramic and quartz, and the cover member is formed to be sufficiently thinner than the dielectric wall portion 2. The sheet-shaped heater 9 is disposed substantially on the whole upper surface of the cover member 10. As shown in FIG. 4, the sheet-shaped heater 9 is constituted by holding a heat generator 63 having a predetermined pattern between resin sheets 61, 62, for example, of polyimide, and has flexibility.

The insulating member 8 is substantially entirely held between the dielectric wall portion 2 and the sheet-shaped heater 9. The insulating member 8 is formed of the dielectric material such as polytetrafluoroethylene (Teflon: registered trademark). Additionally, as an example of actual dimensions, the dielectric wall portion 2 has a length of 120 cm and thickness of 40 mm, the cover member 10 has a thickness of 5 mm, the insulating member 8 has a thickness of 3 mm, and the sheet-shaped heater 9 has a thickness of 0.5 mm. Of course, these numerical values differ depending upon the chamber's specifications. The dielectric wall portion 2 and cover member 10 are formed of the same or similar material, and have substantially the same area.

A lead wire 44 of the sheet-shaped heater 9 extends through the insulating member 41 formed, for example, of polyimide without being exposed inside the chamber 1, to prevent the possibility of a spark from being generated in the vacuum.

Inside the insulating member 41, lead terminals 71 are connected to the lead wire 44, drawn out of the chamber 1 through a connection portion 70 disposed in the lower chamber 1b, and connected to the heater power supply 50. In the heater power supply 50, the lead terminals 71 are connected to an input side of low pass filters 75. The low pass filters 75 are contained in a conductive shield case 76 fixed to a side wall of the grounded chamber 1 via a screw or the like.

Moreover, an output side of the low pass filter 75 is connected to a 60 Hz alternating-current power supply 73 via a wiring 72. An output of the alternating-current power supply 73 is adjusted by a power supply adjuster 74. This constitution prevents the high-frequency power of 13.56 MHz from being conducted to the outside via the wiring 72, or damaging the alternating-current power supply 73.

A processing operation will next be described. In the operation, the aforementioned inductive coupling plasma etching apparatus is used to subject the LCD glass substrate G to the plasma etching.

First, the gate valve 27 is opened, and the substrate G is conveyed into the chamber 1 and laid on a laying surface of the susceptor 22 by a conveyor mechanism (not shown), and fixed onto the susceptor 22 by the electrostatic chuck (not shown). After the conveyer mechanism leaves the chamber, the gate valve 27 is closed.

Subsequently, the process gas including an etching gas is ejected into the chamber 1 from the gas supply system 20 via the gas ejection holes 12a of the shower head 11, and the chamber 1 is evacuated by the exhaust mechanism 30 via the exhaust tube 31, and maintained in a pressure atmosphere, for example, of about 1.33 Pa.

Subsequently, the high frequency power of 13.56 MHz is applied to the antenna 13 from the high-frequency power supply 15, and thereby a uniform induction field is formed in the chamber 1 via the dielectric wall portion 2. By the induction field formed in this manner, the process gas is formed into the plasma, and a high-density inductive coupling plasma is generated in the chamber 1. The ions in the plasma generated in this manner are effectively drawn into the glass substrate G by the high-frequency power of 6 MHz applied to the susceptor 22 from the high-frequency power supply 29, and the substrate G is subjected to a uniform etching process.

During the plasma processing, power is supplied to the sheet-shaped heater 9 from the alternating-current power supply 73 of the heater power supply 50, the cover member 10 is heated at a predetermined temperature, and the reaction product in the chamber 1 is inhibited from adhering to the cover member 10. In this case, due to the insulating member 8, the cover member 10 is heated but the dielectric wall portion 2 is only slightly heated.

Particularly, since the cover member 10 is sufficiently thinner than the dielectric wall portion 2, the energy required for heating can be reduced as compared with the conventional art for heating the dielectric wall portion 2. Additionally, since the dielectric wall portion 2 is hardly heated, heat dissipation toward the atmosphere from the dielectric wall portion 2 can be remarkably reduced.

Therefore, according to the first embodiment, an energy efficiency can be remarkably raised as compared with the conventional art. Moreover, in the conventional art, since the dielectric wall portion 2 is heated, the heating temperature is limited by the melting of the seal ring 7, for example, 120° C. However, since the dielectric wall portion 2 is hardly heated in the first embodiment, the cover member 10 can be heated without considering the melting point of the seal ring 7, and reaction product can be inhibited from adhering.

Furthermore, since the sheet-shaped heater 9 is used to heat the cover member 10, the structure can easily be handled and simplified.

Figure 5:
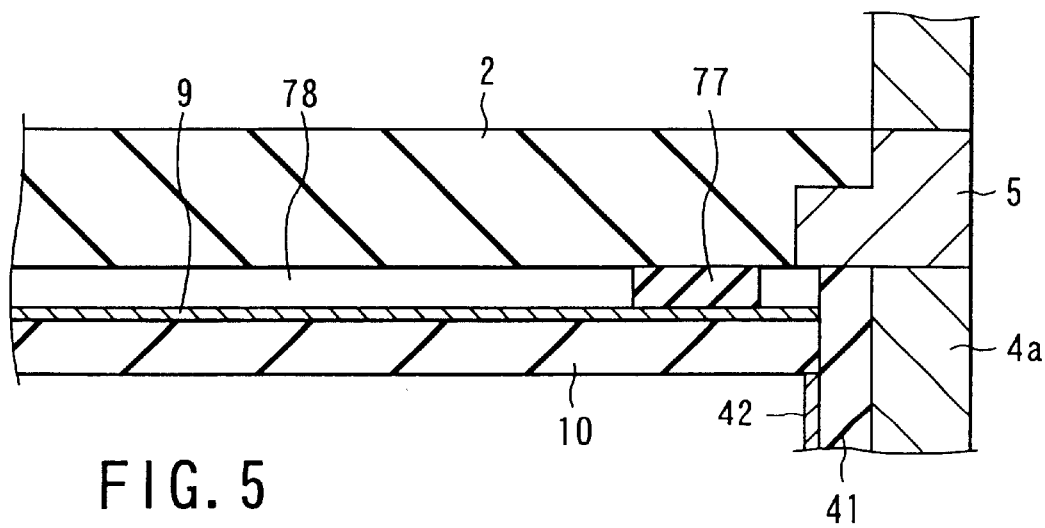
FIG. 5 is a sectional view showing a main part of an apparatus according to a modification example of the plasma processing apparatus shown in FIG. 1.

Additionally, in the first embodiment, the insulation between the dielectric wall portion 2 and the cover member 10 is achieved by the insulating member 8, but this is not limited. As shown in FIG. 5, a spacer 77 may be disposed between the dielectric wall portion 2 and the sheet-shaped heater 9 to form an insulating gap 78.

A second embodiment will next be described.

Figure 6:
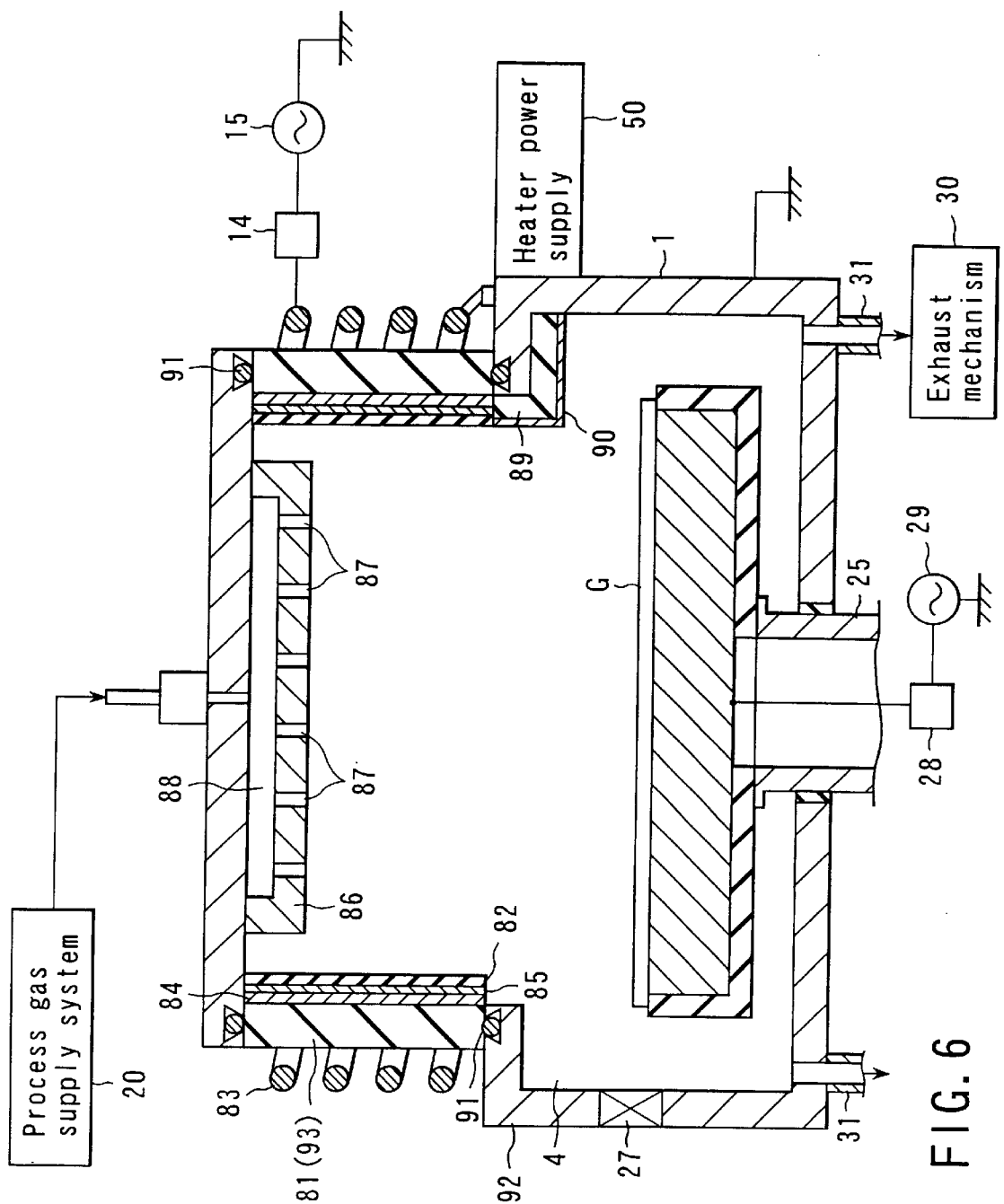
FIG. 6 is a sectional view of the inductive plasma etching apparatus according to a second embodiment of the present invention.

Moreover, in the first embodiment, as shown in FIG. 1, the dielectric wall portion 2 is disposed horizontally to constitute the ceiling of the chamber 1, and the flat antenna 13 is disposed on the portion. However, in the second embodiment, as shown in FIG. 6, a dielectric wall portion 81 (upper chamber 93) is disposed to constitute the side wall of the upper part of the chamber 1 (lower chamber 92), and a coil-shaped high-frequency antenna 83 may be disposed on an outer periphery of the dielectric wall portion 81.

In the processing apparatus, an insulating member 84, sheet-shaped heater 85 and cover member 82 are disposed in this order inside the dielectric wall portion 81. Moreover, a gas introducing shower head 86 formed of aluminum or another metal material is disposed on the ceiling, and gas is ejected via a plurality of gas ejection holes 87 through a gas channel 88 disposed in the ceiling. Moreover, similar to FIG. 3, a lead wire of the sheet-shaped heater 85 extends through an insulating member 89, and is connected to the heater power supply 50. The insulating member 89 is covered with an aluminum cover 90. Furthermore, the dielectric wall portion 81 (upper chamber 93) and chamber 1 (lower chamber 92) are sealed by a seal ring 91. Other members are similar to those of FIG. 1, and therefore denoted with the same reference numerals, and a description thereof is omitted.

Moreover, in the first and second embodiments, the sheet-shaped heater is used as heating means of the cover member, Nonetheless, other heating means such as a quartz heater and ceramic heater may be used in the present invention. Furthermore, the present invention is not limited to the etching apparatus described above; it can be applied to a sputtering apparatus, a CVD apparatus and a plasma processing apparatus. The LCD substrate is treated in the embodiment, but other substrates such as a semiconductor wafer may be treated in this invention. Moreover, the dielectric wall, or the upper part of the processing chamber, is not limited to a flat one. A dome shape may be used instead.

As described above, according to the present invention, the cover member formed of the dielectric material disposed in the dielectric wall portion to cover the dielectric wall portion is heated by the heating means, the reaction product is prevented from being deposited, and the dielectric wall portion and heating means are insulated by the insulating means. Therefore, only the cover member is substantially heated, and the dielectric wall portion is hardly heated. In this case, since the cover member can be sufficiently thinner than the dielectric wall portion, the required heating energy itself can be reduced as compared with the energy for heating the dielectric wall portion, the dielectric wall portion is hardly heated, and heat dissipation toward the atmosphere from the dielectric wall portion can therefore be reduced. Therefore, the energy efficiency can be remarkably raised.

Moreover, when the seal member for sealing the dielectric wall portion and another wall portion of the processing chamber is disposed, in the conventional art the dielectric wall portion is heated, and therefore the heating temperature is usually limited to the melting point of the resin seal member. However, in the present invention, the dielectric wall portion is not substantially heated, the seal member is therefore not heated, and the apparatus can be heated to prevent the reaction product from adhering to the cover member without considering the melting point of the seal member.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inductive coupling plasma processing apparatus comprising:

a lower chamber forming a processing chamber in which a substrate to be treated is subjected to a plasma processing;

an upper chamber forming an antenna chamber in which a high-frequency antenna for forming an induction field in said processing chamber by a high-frequency power supplied from the outside is disposed;

a dielectric wall portioning said upper chamber from said lower chamber;

a shower head comprising ejection ports for ejecting a process gas and a gas channel, provided in said processing chamber;

insulating means attached to the surface of said dielectric wall portion on a side of said processing chamber;

heating means disposed on the surface of said insulating means on said processing chamber side; and a cover member formed of a dielectric material attached to said heating means on said processing chamber side, wherein said insulating means prevents heat generated from said heating means from being conducted to said dielectric wall portion, and said heating means heats said cover member at a temperature at which a reaction product generated by a plasma is prevented from adhering to said cover member.

2. The apparatus according to claim 1, wherein said insulating means comprises an insulating member formed by the dielectric material held between said dielectric wall portion and said heating means.

3. The apparatus according to claim 1, wherein said insulating means has a gap disposed between said dielectric wall portion and said heating means.

4. The apparatus according to claim 1, wherein said heating means comprises:

a sheet-shaped heater;

a low pass filter connected to said heater; and a heater power supply, and said low pass filter and said heater power supply are contained in a shield case fixed to an outer wall of said lower chamber.

5. The apparatus according to claim 1, wherein a thermal capacity of said cover member is smaller than the thermal capacity of said dielectric wall portion.

6. The apparatus according to claim 1, wherein said support shelf portion supporting the dielectric wall and said dielectric wall portion are supported via a seal ring.

7. An inductive coupling plasma processing apparatus including a processing chamber in which a plasma is generated in an atmosphere including a process gas, a high-frequency antenna for receiving high-frequency power and generating an inductive electric field in the processing chamber, and a dielectric wall disposed to contact the plasma, said inductive coupling plasma processing apparatus comprising:

a cover member disposed to prevent a main portion of said dielectric wall portion from being exposed in said processing chamber, and formed of a dielectric material;

heating means for heating said cover member at a temperature at which a reaction product produced by the plasma generated in said processing chamber is inhibited from adhering to said cover member; and insulating means for preventing heat generated by said heating means from being conducted to said dielectric wall portion.

8. The apparatus according to claim 7, wherein said insulating means comprises an insulating member formed by the dielectric material held between said dielectric wall portion and said heating means.

9. The apparatus according to claim 7, wherein said insulating means has a gap disposed between said dielectric wall portion and said heating means.

10. An inductive coupling plasma processing apparatus comprising:

a processing chamber for subjecting a substrate to be treated to a plasma processing;

a process gas supply system for supplying a process gas into said processing chamber;

an exhaust system for evacuating said processing chamber;

a dielectric wall portion constituting an upper part wall portion of said processing chamber;

a high-frequency antenna, disposed on an upper surface of said dielectric wall portion outside said processing chamber, for forming an induction field by a supplied high-frequency power in said processing chamber;

a cover member formed of a dielectric material disposed inside said processing chamber of said dielectric wall portion to cover said dielectric wall portion;

a sheet-shaped heater disposed between said cover member and said dielectric wall portion; and an insulating member, disposed between said dielectric wall portion and said sheet-shaped heater, for insulating between said dielectric wall portion and said heater, wherein the process gas is formed into a plasma by said induction field and the substrate to be treated is subjected to the plasma processing.

11. An inductive coupling plasma processing apparatus comprising:

a processing chamber for subjecting a substrate to be treated to a plasma processing;

a process gas supply system for supplying a process gas into said processing chamber;

an exhaust system for evacuating said processing chamber;

a dielectric wall portion constituting an upper wall of said processing chamber;

a high-frequency antenna, disposed on an upper surface of said dielectric wall portion outside said processing chamber, for forming an induction field by a supplied high-frequency power in said processing chamber;

a cover member formed of a dielectric material disposed inside said processing chamber of said dielectric wall portion to cover said dielectric wall portion;

a sheet-shaped heater disposed between said cover member and said dielectric wall portion; and an insulating member, disposed between said dielectric wall portion and said sheet-shaped heater, for insulating between said dielectric wall portion and said heater, wherein the process gas is formed into a plasma by said induction field and the substrate to be treated is subjected to the plasma processing.

12. The apparatus according to claim 11, wherein the upper wall is shaped like a dome.

* * * * *